United States Patent
Schmid

(10) Patent No.: US 7,083,099 B2
(45) Date of Patent: Aug. 1, 2006

(54) OPTICALLY PUMPED, VERTICALLY EMITTING SEMICONDUCTOR LASER

(75) Inventor: Wolfgang Schmid, Deuerling (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/491,201

(22) PCT Filed: Sep. 26, 2002

(86) PCT No.: PCT/DE02/03651

§ 371 (c)(1),
(2), (4) Date: Oct. 13, 2004

(87) PCT Pub. No.: WO03/030316

PCT Pub. Date: Apr. 10, 2003

(65) Prior Publication Data

US 2005/0036528 A1 Feb. 17, 2005

(30) Foreign Application Priority Data

Sep. 28, 2001 (DE) ............... 101 47 888

(51) Int. Cl.
G06K 7/10 (2006.01)
(52) U.S. Cl. ............... 235/462.01; 235/454
(58) Field of Classification Search ............... 235/462.01–462.43, 454, 455; 372/36, 94, 372/50.1, 45.01, 44.011, 92, 44; 359/638, 359/639

See application file for complete search history.

(56) References Cited

U.S. PATENT DOCUMENTS

| 6,088,378 | A | * | 7/2000 | Furukawa | ............... 372/92 |
|---|---|---|---|---|---|
| 6,285,702 | B1 | | 9/2001 | Caprara et al. | |
| 6,566,155 | B1 | * | 5/2003 | Numai | ............... 438/31 |
| 2002/0090016 | A1 | | 7/2002 | Hall et al. | |
| 2002/0105984 | A1 | * | 8/2002 | Yamamoto et al. | ............... 372/44 |
| 2004/0179568 | A1 | * | 9/2004 | Amann et al. | ............... 372/45 |
| 2005/0036528 | A1 | * | 2/2005 | Schmid | ............... 372/36 |
| 2005/0111079 | A1 | * | 5/2005 | Wang et al. | ............... 359/344 |

FOREIGN PATENT DOCUMENTS

EP 0653 823 A 5/1995

(Continued)

OTHER PUBLICATIONS

Mark Kuznetsov et al., "Design and Characteristics of High-Power (>0.5-W CW) Diode-Pumped Vertical-External-Cavity Surface-Emitting Semiconductor Lasers with Circular $TEM_{00}$ Beams", IEEE Journal of Selected Topics in Quantum Electronics, vol. 5, No. 3, pp. 561-573, May/Jun. 1999.

(Continued)

Primary Examiner—Thien M. Le
(74) Attorney, Agent, or Firm—Cohen, Pontani, Lieberman & Pavane

(57) ABSTRACT

An optically pumped vertically emitting semiconductor laser having a highly reflective reflector layer (10), and a radiation-emitting active layer sequence (14) arranged on the reflector layer, in which, during operation, the reflector layer (10), together with an external mirror (20), forms a laser resonator. A heat sink (12), transparent to the emitted radiations is arranged within the laser resonator (10, 20) and in thermal contact with the active layer sequence (14), said heat sink being formed from a material having a higher thermal conductivity than the materials of the active layer sequence (14).

21 Claims, 4 Drawing Sheets

FOREIGN PATENT DOCUMENTS

| | | |
|---|---|---|
| EP | 0 748 007 A | 12/1996 |
| EP | 0 860 915 A | 8/1998 |
| WO | WO 00/08727 | 2/2000 |

OTHER PUBLICATIONS

Eckart Schiehlen, "Optically-Pumped Surface-Emitting Lasers", Annual Report 2000, Optoelectronics Department, University of Ulm, pp. 59-64.

M. Ortsiefer et al., "Low-threshold index-guided 1.5 μm long-wavelength vertical-cavity surface-emitting laser with high efficiency", Applied Physics Letters, American Institute of Physics, vol. 10, No. 16, pp. 2179-2181, Apr. 2000.

M. Grabherr et al., "Bottom-Emitting VCSEL's for High-CW Optical Output Power", IEEE Phototonics Technology Letters, Inc., vol. 10, No. 8, pp. 1061-1063, Aug. 1998.

* cited by examiner

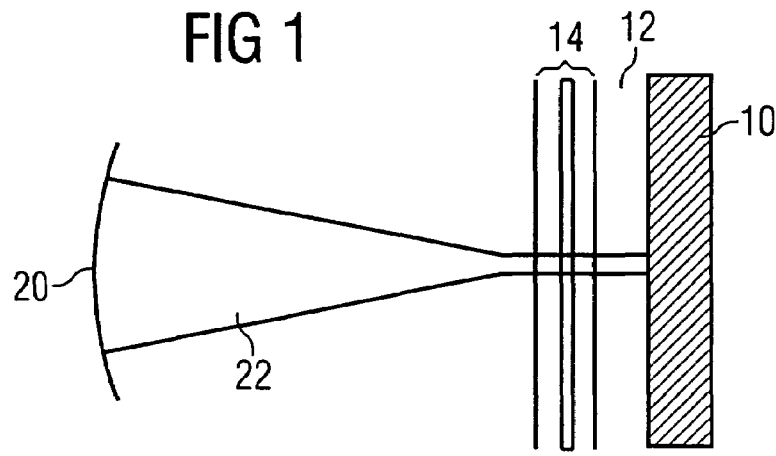
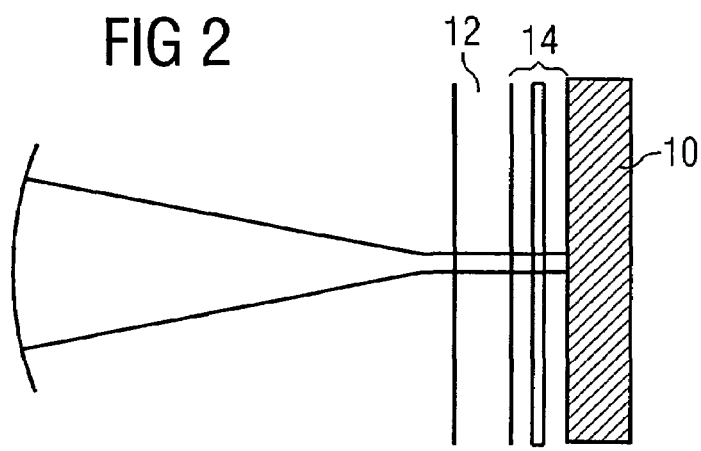
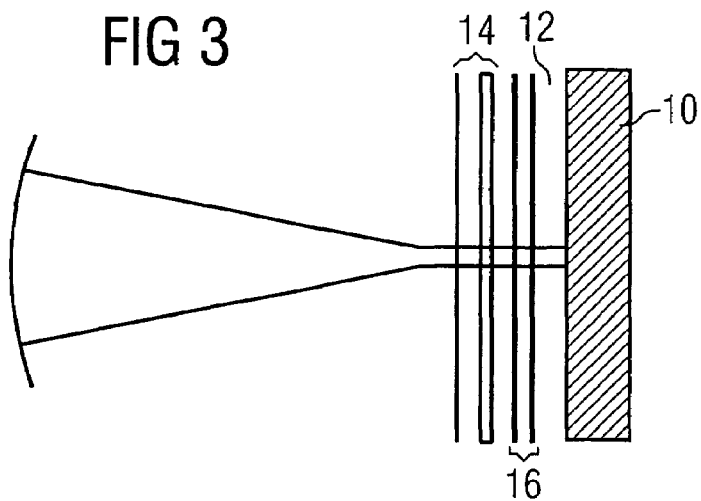

ोपTICALLY PUMPED, VERTICALLY EMITTING SEMICONDUCTOR LASER

RELATED APPLICATIONS

This is a U.S. national stage of application No. PCT/DE02/03651, filed on 26 Sep. 2002.

This patent application claims the priority of German patent application 101 47 888.7 filed 28 Sep. 2001, the disclosure content of which is hereby incorporated by reference.

FIELD OF THE INVENTION

The invention relates to an optically pumped vertically emitting semiconductor laser having a highly reflective reflector layer, and a radiation-emitting active layer sequence arranged on the reflector layer, in which, during operation, the reflector layer, together with an external mirror, forms a laser resonator.

BACKGROUND OF THE INVENTION

Such semiconductor lasers are disclosed for example in the article M. Kuznetsov et al., "Design and Characteristics of High-Power (>0.5 W CW) Diode-Pumped Vertical-External-Cavity Surface-Emitting Semiconductor Lasers with Circular $TEM_{00}$ Beams", IEEE J. Selected Topics Quantum Electron., Vol. 5, No. 3, pp. 561–573, 1999.

These VECSELs enable a high continuous wave radiation power into the watts range with a good beam quality. However, during high-power continuous wave operation, the problem arises of efficiently dissipating from the component the heat loss generated for example by nonradiative recombinations.

For this purpose, the optically pumped VECSEL described by Kuznetsov et al. is mounted on a diamond heat sink having a high thermal conductivity. Since the growth substrate substantially contributes to the thermal impedance of the component, it is preferably removed and the VECSEL is applied to the heat sink directly with the mirror layers.

However, this procedure necessitates an upside-down mounting of the component. In addition, when the growth substrate is removed, there is the risk of the component being fractured.

SUMMARY OF THE INVENTION

One object of the invention is to provide a vertically emitting semiconductor laser that can be reliably operated even at high continuous wave powers.

This and other objects are attained in accordance with one aspect of the invention directed to an optically pumped vertically emitting semiconductor laser having a highly reflective reflector layer, a radiation-emitting active layer sequence arranged on the reflector layer, in which, during operation, the reflector layer together with an external mirror forms a laser resonator, wherein a heat sink transparent to the emitted radiation is arranged within the laser resonator and in thermal contact with the active layer sequence, said heat sink being formed from a material having a higher thermal conductivity than the materials of the active layer sequence.

Another aspect of the invention is directed to an optically pumped vertically emitting semiconductor laser having a radiation-emitting active layer sequence and two external mirrors which form a vertical resonator, wherein a heat sink transparent to the emitted radiation is arranged within the vertical resonator and in thermal contact with the active layer sequence, said heat sink being formed from a material having a higher thermal conductivity than the materials of the active layer sequence.

Yet another aspect of the invention is directed to a vertically emitting semiconductor laser, in which the edge emitting laser structure or a plurality of edge emitting laser structures is or are grown by means of epitaxy before or after the epitaxial fabrication of the structure (100) of the optically pumped vertically emitting semiconductor laser (140) on the common substrate (100).

An aspect of the invention is based on the observation that the reflector layer, which is usually formed by a distributed Bragg reflector, that is to say an alternating sequence of layers having a high and low refractive index with a thickness of $\lambda/4n$, constitutes a significant obstacle to the dissipation of heat. Proceeding from this, the invention is based on the concept, for the heat dissipation, of bypassing the reflector layer or of using heat spreading to increase the area over which the reflector layer has to dissipate the heat.

This aim is achieved by means of a heat sink which is arranged within the resonator and is in thermal contact with the active layer sequence, the thermal conductivity of which is higher than that of the materials of the active layer.

In this case, the configuration of the heat sink and of the reflector layer makes it possible for the dissipated heat flow to practically completely bypass the reflector layer.

As an alternative, it is possible to fashion the heat sink such that the dissipated heat flow is spread and flows through the reflector layer over a larger area. Since the thermal resistance is inversely proportional to the cross-sectional area of the heat flow, a reduction of the thermal resistance is achieved.

Preferably, the heat sink is formed from readily thermally conductive materials which are transparent in the red and/or near infrared, such as SiC, BN or diamond.

In an advantageous refinement, the heat sink is formed by a layer having a thickness of at least 0.2 times the diameter of the active zone. It may have, for example, a thickness of between 3 and 50 μm, preferably between 5 and 30 μm, particularly preferably between 10 and 20 μm.

The heat sink is expediently arranged between the active layer sequence and the reflector layer. The heat flow is then expanded by the heat sink between the active layer sequence and the reflector layer and the thermal resistance of the reflector layer is thus reduced.

In this case, the heat sink may be in direct contact with the active layer sequence, or a partly reflective Bragg reflector may be arranged between the heat sink and the active layer sequence. This last is expedient in particular when the reflectivity of the reflector layer behind the heat sink alone is insufficient and the reflector layer comprises gold, for example.

In preferred refinements, the reflector layer is formed by a distributed Bragg reflector containing layers alternately having a high and low refractive index with a thickness of essentially $\lambda/4n$. In this case, $\lambda$ designates the wavelength of the radiation emitted by the active zone and n designates the refractive indices of the corresponding layer.

The individual reflections at the layers are then superposed constructively, thereby achieving a high total reflectivity of greater than 99%, preferably greater than 99.5%, particularly preferably greater than 99.9%. The reflectivity R of a Bragg mirror comprising m layer pairs having refractive indices n1 and n2, respectively, is given by $$R = \frac{1-(n1/n2)^m}{1+(n1/n2)^m}$$

Thus, a high reflectivity requires a large index contrast n1/n2 and a sufficient number of layer pairs. Moreover, for the validity of the aforementioned formula, the layer thickness has to be met sufficiently precisely.

In the context of the invention, the Bragg mirror may either be grown epitaxially, or dielectric layers are deposited. While the last-mentioned method yields high index contrasts, the required thicknesses can be met precisely only with difficulty. Moreover, dielectrics have only a low thermal conductivity.

With the use of epitaxial semiconductor layers, the required thicknesses can be complied with very precisely and the thermal conductivity is somewhat higher than that of the dielectrics. On the other hand, it is necessary that the materials do not absorb at the emission wavelength and that the lattice constant must be identical for all the layers. Other lattice constants produce crystal defects which, besides a poorer mirror, prevent the growth of a high-quality active layer sequence. Consequently, the use of epitaxial semiconductor layers entails limitation to a few materials.

In the infrared, by way of example, it is possible to use the AlGaAs material system which is grown in lattice-matched fashion on GaAs substrates: in the infrared, the refractive indices are about 3.0 (AlAs) and 3.5 (GaAs) and the lattice constant is virtually independent of the aluminum content.

For red-emitting VECSELs, the Bragg mirror may likewise comprise the AlGaAs system. Owing to the shorter wavelength, however, GaAs absorbs and must therefore be replaced by AlGaAs with at least 60% aluminum. The mixed semiconductor in turn has a poorer thermal conductivity than the binary semiconductors AlAs and GaAs. Moreover, the index contrast is reduced, which has to be compensated for by a higher number of mirror pairs.

The thermal conductivity of the Bragg mirror has proved to be very critical: although for example GaAs and AlAs have thermal conductivities of 46 and 91 W/(m K), two successive thin layers made of different materials have a poorer thermal conductivity since, owing to the change in the crystal, the lattice vibrations (phonons) do not correspond. Therefore, the lattice vibrations are partly reflected at these interfaces and the entire thermal resistance is thus increased owing to this heat transfer resistance.

In this case, a real Bragg mirror typically comprises 30 or 40 layer pairs, that is to say 60 or 80 interfaces, respectively, which in each case contribute to the thermal resistance.

The heat sink or a further heat sink may also be arranged on that side of the active layer sequence which is remote from the reflector layer, so that the heat is predominantly conducted not directly via the reflector layer but into the heat sink.

Ultimately, the heat can, of course, flow from the heat sink again via the reflector layer, but then, owing to the heat spreading, over a significantly larger area and thus a lower resistance.

As an alternative, heat sink and reflector layer may be arranged such that the heat flows away outside the reflector layer from the heat sink into a substrate or some other larger heat reservoir.

This may be done for example by the Bragg mirror being formed only in a central region of the component, so that the heat can be dissipated in an outer region without having to flow through the Bragg mirror.

In a different configuration, the optically pumped vertically emitting semiconductor laser has a radiation-emitting active layer sequence and two external mirrors, which form a vertical resonator. A heat sink transparent to the emitted radiation is arranged within the vertical resonator and in thermal contact with the active layer sequence, said heat sink being formed from a material having a higher thermal conductivity than the materials of the active layer sequence.

The arrangement according to the invention is particularly preferably used in optically pumped vertically emitting semiconductor lasers in which the pump source is arranged laterally with respect to the optically pumped vertically emitting semiconductor laser and is monolithically integrated together with the latter on a common substrate. In this case, the pump source preferably has an edge emitting laser structure or a plurality of edge emitting laser structures which is or are grown by means of epitaxy before or after the epitaxial fabrication of the structure of the optically pumpable vertically emitting semiconductor laser on the common substrate. Such laser arrangements are disclosed in co-pending U.S. patent application Ser. No. 09/824,086 and, therefore, are not explained in any further detail at this juncture.

In all the embodiments mentioned, the radiation-emitting active layer sequence may comprise a GaAs- or InP-based semiconductor material, in particular InGaAs, AlGaAs, InGaAlAs, InGaP, InGaAsP, InGaAlP, InAlP or a sequence of layers made of one or more of these materials.

BRIEF DESCRIPTION OF THE DRAWINGS

The invention is explained in more detail below using exemplary embodiments in conjunction with the drawings. Only the elements essential for understanding the invention are illustrated in each case in the drawings, in which:

FIGS. 1–6 show diagrammatic sectional illustrations of different embodiments of the invention;

DETAILED DESCRIPTION OF THE DRAWINGS

Figure 4:
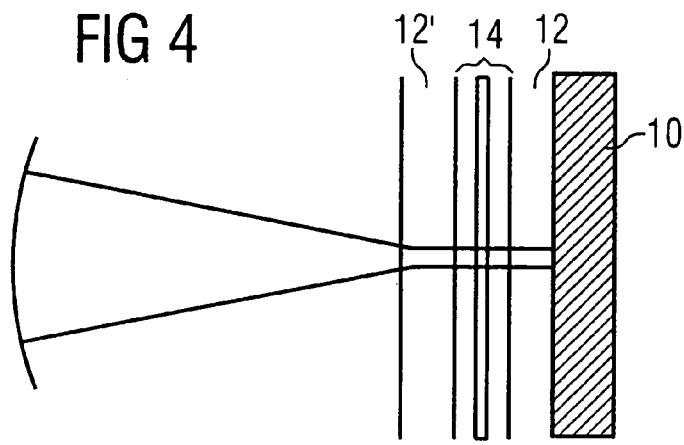

FIG. 1 shows an embodiment of an optically pumped vertically emitting semiconductor laser (VECSEL) according to the invention in a diagrammatic illustration. A heat sink 12, for instance an SiC layer 10 μm thick, is arranged between the Bragg mirror 10 and the active layer sequence 14.

The laser resonator is formed by the Bragg mirror 10 and the external concave mirror 20, by means of which some of the radiation 22 circulating in the resonator is also coupled out.

The VECSEL is optically pumped in a manner known per se, for example a VECSEL emitting at 950 nm through focusing of the multimode beam of an 808 nm standard high-power pump diode.

The pump power is absorbed in the active medium, as a result of which, besides the desired laser emission, heat also arises, in particular through nonradiative recombination of excited charge carriers. This heat has to flow away via the Bragg mirror 10 into an adjoining substrate or another heat reservoir.

The cross-sectional area of the heat flow is greatly enlarged by the heat sink 12 compared with the cross-sectional area of the laser radiation 22 through lateral thermal diffusion. The heat flow therefore flows over a larger area through the Bragg mirrors 10, as a result of which the thermal resistance is correspondingly reduced.

Another embodiment is shown in FIG. 2, where the heat sink 12 is arranged on that side of the active layer sequence 14 which is remote from the Bragg mirror 10. In this case, the heat generated in the active layer sequence 14 flows into the heat sink 12, where it propagates through lateral thermal diffusion over a large area before it finally flows away via the Bragg mirror 10 into the substrate (not shown). In this case, structuring of the Bragg mirror can also achieve a situation in which a large part of the heat flows into the substrate while bypassing the mirror, such as by having gaps through which the heat sink is thermally connected to the substrate.

Figure 7:
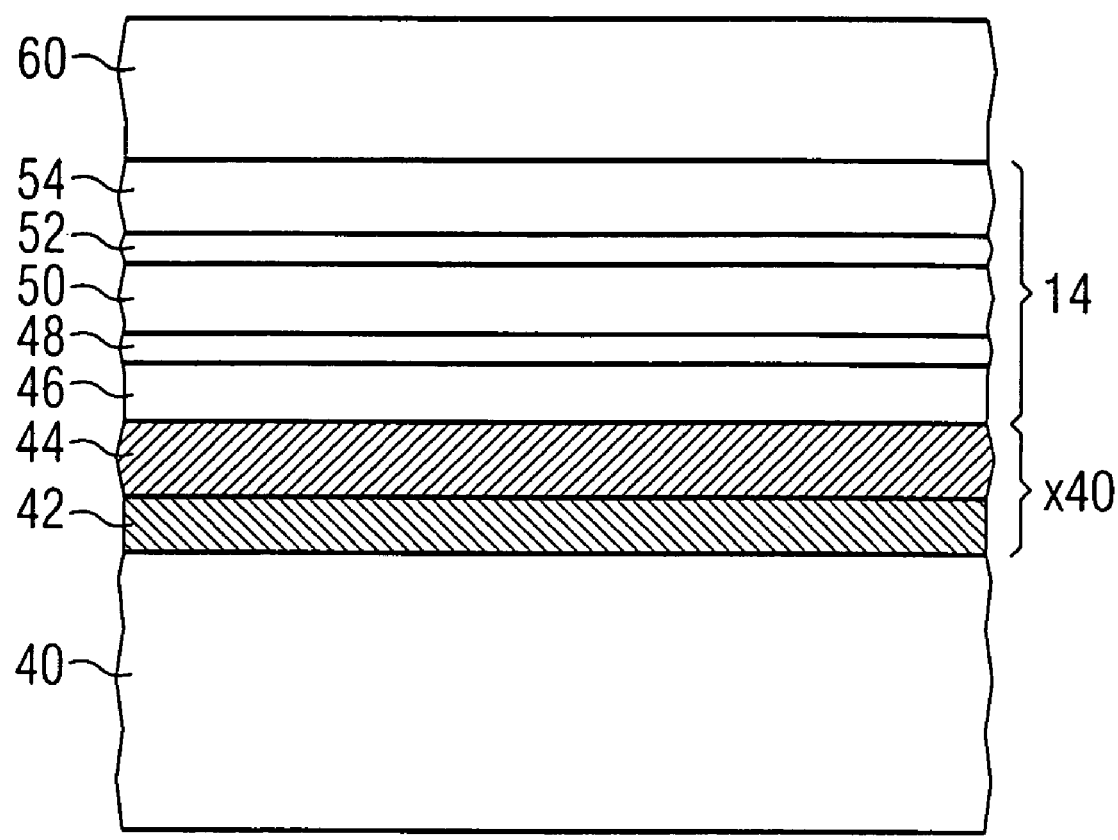
FIG. 7 shows a diagrammatic sectional illustration of the layer sequence of the semiconductor laser of FIG. 2.

One possible layer sequence for the embodiment of FIG. 2 is illustrated in FIG. 7. A Bragg mirror, comprising 40 layer pairs of AlAs (reference symbol 42) and AlGaAs (reference symbol 44) with an aluminum proportion of at least 60%, is grown epitaxially on a GaAs substrate 40. Each of the layers 42, 44 has a thickness of $\lambda/4n$, that is to say a thickness of about 50 nm at an emission wavelength of $\lambda=650$ nm.

The active layer sequence 14 is grown on the Bragg mirror, said active layer sequence comprising two InGaP quantum wells 48, 52 having a width of about 5 nm and InAlP barriers 46, 50, 54 having a thickness of $\lambda/4n$. In this case, the number of quantum wells may also be larger, for example 6 or 10. An SiC layer 60 having a thickness of 10 μm is applied, as a heat sink, to the active layer sequence 14 for the purpose of lateral heat spreading.

In the embodiment according to FIG. 3, the mirror 10 is formed by a gold layer. The lower reflectivity of such a mirror can be compensated for by a Bragg mirror 16 of reduced periodicity arranged between active layer sequence 14 and heat sink 12. Owing to the smaller number of layer sequences of the Bragg mirror compared to a Bragg mirror in a structure without a gold mirror, the thermal resistance of this Bragg mirror 16 is also lower, thereby achieving overall a better heat dissipation in comparison with conventional configurations.

FIG. 4 shows a further embodiment of a VECSEL, in which heat sinks 12 and 12' are arranged on both sides of the active layer sequence 14. The advantages described in connection with FIGS. 1 and 2 are thereby combined.

Figure 5:
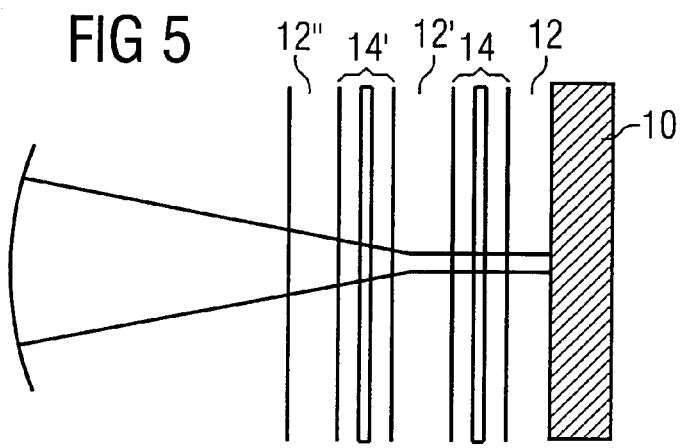

It is furthermore possible to arrange a plurality of sequences comprising active layer sequence and heat sink one behind the other, as shown in FIG. 5, where two active layer sequences 14 and 14' in each case adjoin heat sinks 12, 12' and 12', 12'', respectively, on both sides.

Figure 6:
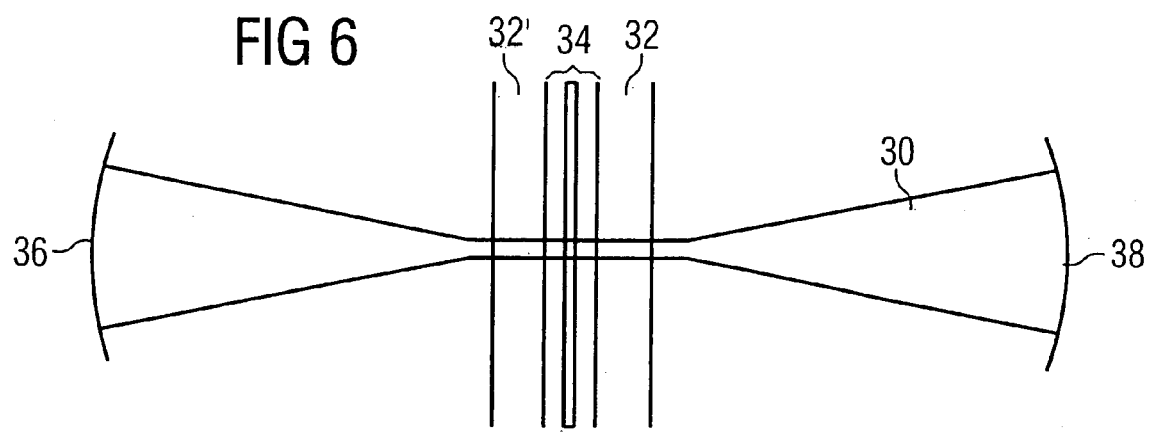

Another optically pumped vertically emitting semiconductor laser is illustrated in FIG. 6. In this configuration, the internal mirror 10 is replaced by a second external mirror, so that a vertical resonator is formed by two external concave mirrors 36, 38, in which the laser radiation 30 circulates.

The active layer sequence 34 is arranged between two heat sinks 32, 32', in each case BN layers having a thickness of 15 μm in the exemplary embodiment.

Figure 8:
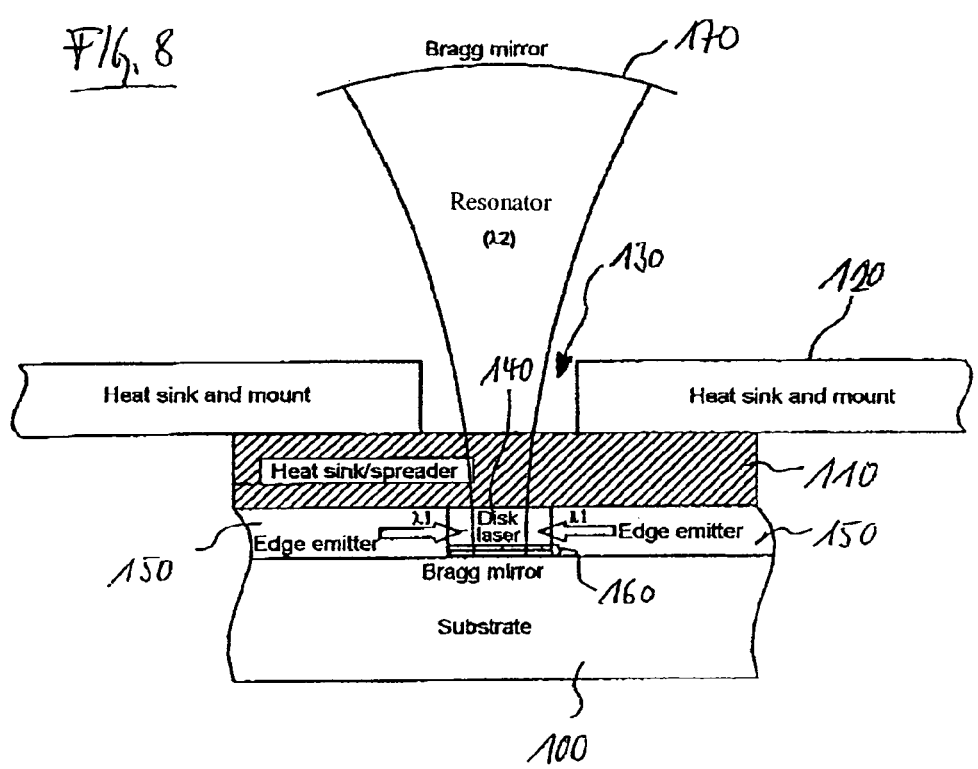
FIG. 8 shows a diagrammatic sectional illustration of a further exemplary embodiment.

In the exemplary embodiment illustrated in FIG. 8, an optically pumpable vertically emitting semiconductor laser structure 140 is monolithically integrated together with an edge emitting laser structure 150 on a common substrate 100. The edge emitting laser structure 150 represents the pump source for the optically pumpable vertically emitting semiconductor laser structure 140. The optically pumpable vertically emitting semiconductor laser structure 140 and the edge emitting laser structure 150 are applied by means of epitaxy on the substrate 100, it being possible to grow the edge emitting laser structure 150 before or after the epitaxial fabrication of the structure of the optically pumpable vertically emitting semiconductor laser 140 on the common substrate 100. Situated on the laser structures is a thermally conductive layer 110, which serves as heat sink or heat spreader, situated on which, in turn, is a heat sink 120 with a radiation window 130 arranged above the optically pumpable vertically emitting semiconductor laser structure 140. Situated between the optically pumpable vertically emitting semiconductor laser structure 140 and the substrate 100 is a Bragg mirror 160, which, together with a Bragg mirror 170 arranged behind the radiation window 130 as seen from the optically pumpable vertically emitting semiconductor laser structure 140, forms the laser resonator for the optically pumpable vertically emitting semiconductor laser structure 140. The material of layer 110 is permeable to the laser radiation, and the material for layer 120 is impermeable to the laser radiation.

The extent to which the invention is protected is not limited by the description of the invention with the aid of the exemplary embodiments. Rather, the invention covers every novel feature and every combination of features, and this includes, in particular, every combination of features in the patent claims, even if this combination is not explicitly specified in the patent claims.

The invention claimed is:

1. An optically pumped vertically emitting semiconductor laser comprising:
   a highly reflective reflector layer wherein, during operation, the reflector layer and an external mirror form a laser resonator;
   a radiation-emitting active layer sequence arranged on the reflector layer; and
   a heat sink transparent to the emitted radiation and arranged within the laser resonator and in thermal contact with the active layer sequence, said heat sink being formed from a material having a thermal conductivity higher than a thermal conductivity of materials of the active layer sequence.

2. The vertically emitting semiconductor laser of claim 1, wherein the heat sink is formed from readily thermally conductive materials which are transparent in the red or near infrared.

3. The vertically emitting semiconductor laser of claim 1, wherein the heat sink is formed by a layer having a thickness of at least 0.2 times the diameter of an active zone of the active layer sequence.

4. The vertically emitting semiconductor laser of claim 1, wherein the heat sink is arranged between the active layer sequence and the reflector layer.

5. The vertically emitting semiconductor laser of claim 4, wherein the heat sink is in direct contact with the active layer sequence.

6. The vertically emitting semiconductor laser of claim 4, further comprising a partly reflective Bragg reflector arranged between the heat sink and the active layer sequence.

7. The vertically emitting semiconductor laser of claim 4, wherein the reflector layer is formed by a distributed Bragg reflector.

8. The vertically emitting semiconductor laser of claim 6, wherein the reflector layer is formed by a metal layer.

9. The vertically emitting semiconductor laser of claim 3, wherein the heat sink or a second heat sink is arranged on that side of the active layer sequence which is remote from the reflector layer.

10. An optically pumped vertically emitting semiconductor laser comprising:
a radiation-emitting active layer sequence;
two external mirrors, which form a vertical resonator; and
a heat sink transparent to the emitted radiation and arranged within the vertical resonator and in thermal contact with the active layer sequence, said heat sink being formed from a material having a thermal conductivity higher than a thermal conductivity of materials of the active layer sequence.

11. The vertically emitting semiconductor laser of claim 10, wherein the active layer sequence comprises a GaAs- or InP-based semiconductor material.

12. The vertically emitting semiconductor laser of claim 10, wherein a the pump source is arranged beside the vertically emitting semiconductor laser and is monolithically integrated together with the vertically emitting semiconductor laser on a common substrate.

13. The vertically emitting semiconductor laser of claim 12, wherein the pump source has at least one edge emitting laser structure.

14. A vertically emitting semiconductor laser, comprising an edge emitting laser structure which is grown on a common substrate by means of epitaxy before or after epitaxial fabrication of a structure of an optically pumped vertically emitting semiconductor laser on the common substrate.

15. The vertically emitting semiconductor laser of claim 1, wherein the active layer sequence comprises a GaAs- or InP-based semiconductor material.

16. The vertically emitting semiconductor laser of claim 1, wherein a pump source is arranged beside the vertically emitting semiconductor laser and is monolithically integrated together with the vertically emitting semiconductor laser on a common substrate.

17. The vertically emitting semiconductor laser of claim 16, wherein the pump source has at least one edge emitting laser structure.

18. The vertically emitting semiconductor laser of claim 2, wherein the heat sink is formed from SiC, BN or diamond.

19. The vertically emitting semiconductor laser of claim 11, wherein the active layer sequence comprises one of InGaAs, AlGaAs, InGaAlAs, InGaP, InGaAsP, InGaAlP and InAlP, or a sequence of layers made of at least one of InGaAs, AlGaAs, InGaAlAs, InGaP, InGaAsP, InGaAlP and InAlP.

20. The vertically emitting semiconductor laser of claim 15, wherein the active layer sequence comprises one of InGaAs, AlGaAs, InGaAlAs, InGaP, InGaAsP, InGaAlP and InAlP, or a sequence of layers made of at least one of InGaAs, AlGaAs, InGaAlAs, InGaP, InGaAsP, InGaAlP and InAlP.

21. The vertically emitting semiconductor laser of claim 14, wherein the edge emitting laser structure is arranged to optically pump the structure of the vertically emitting semiconductor laser.

* * * * *

UNITED STATES PATENT AND TRADEMARK OFFICE
CERTIFICATE OF CORRECTION

PATENT NO. : 7,083,099 B2  Page 1 of 1
APPLICATION NO. : 10/491201
DATED : August 1, 2006
INVENTOR(S) : Wolfgang Schmid It is certified that error appears in the above-identified patent and that said Letters Patent is hereby corrected as shown below:

At Column 7, please amend claim 12 as follows:

--12. The vertically emitting semiconductor laser of claim 10, wherein a ~~the~~ pump source is arranged beside the vertically emitting semiconductor laser and is monolithically integrated together with the vertically emitting semiconductor laser on a common substrate.--

Signed and Sealed this

First Day of April, 2008

JON W. DUDAS
*Director of the United States Patent and Trademark Office*

Disclaimer

Patent No. 7,083,099 - Wolfgang Schmid, Deuerling, DE. OPTICALLY PUMPED, VERTICALLY EMITTING SEMICONDUCTOR LASER. Patent dated Aug. 01, 2006. Disclaimer filed Dec. 11, 2006, by the assignee, OSRAM OPTO SEMICONDUCTOR GMBH.

Hereby enters this disclaimer to claims 14 and 21 of said patent.

*(Official Gazette September 23, 2008)*